United States Patent [19]

Yasuda et al.

[11] Patent Number: 4,763,004
[45] Date of Patent: Aug. 9, 1988

[54] CALIBRATION METHOD FOR ELECTRON BEAM EXPOSER

[75] Inventors: Hiroshi Yasuda; Takayuki Miyazaki, both of Yokohama, Japan

[73] Assignee: Fujitsu Limited, Kawasaki, Japan

[21] Appl. No.: 689,010

[22] Filed: Jan. 4, 1985

[30] Foreign Application Priority Data

Jan. 10, 1984 [JP] Japan .................... 59-3081

[51] Int. Cl.$^4$ .......................... G01M 23/00
[52] U.S. Cl. ................. 250/396 R; 250/396 ML; 382/22; 324/404
[58] Field of Search ......... 250/491.1, 396 R, 396 ML, 250/397, 307, 310, 311; 382/22, 54; 324/404

[56] References Cited

U.S. PATENT DOCUMENTS

| | | | |
|---|---|---|---|
| 4,162,403 | 7/1979 | Baumgarten | 250/396 ML |
| 4,180,738 | 12/1979 | Smith | 250/396 ML |
| 4,214,163 | 7/1980 | Namae | 250/396 ML |
| 4,336,597 | 6/1982 | Okubo et al. | |
| 4,362,942 | 12/1982 | Yasuda | 250/398 |
| 4,363,104 | 12/1982 | Nussmeier | 382/22 |
| 4,553,260 | 11/1985 | Belt | 382/22 |
| 4,585,943 | 4/1986 | Yasuda | 250/396 ML |
| 4,607,333 | 8/1986 | Yasutake | 250/398 |

FOREIGN PATENT DOCUMENTS

| | | |
|---|---|---|
| 0030347 | 6/1981 | European Pat. Off. |
| 2002547 | 2/1979 | United Kingdom |
| 2059120 | 4/1981 | United Kingdom |

OTHER PUBLICATIONS

Engelke: "Correction of Nonlinear Deflection Distortion . . . ", IBM J. Res. Develop.-Nov. 1977-pp. 506-513.

Patent Abstracts of Japan, vol. 5, No. 55, (E-52)[727], Apr. 16, 1981, & JP-A56 7341, (Nippon Denshi K.K.), 01-26-81.

Patent Abstracts of Japan, vol. 7, No. 62, (E-164)[1207], May 15, 1983; and JP-A-57 208 140, (Fujitsu K.K.), 12-21-82.

*Primary Examiner*—Reinhard J. Eisenzopf
*Assistant Examiner*—Jose M. Solis
*Attorney, Agent, or Firm*—Staas & Halsey

[57] ABSTRACT

A method of correcting the aberration of an electron beam due to astigmatism and field curvature of focus by feeding a correction current through stigmator coils and a focus correction coil. The correction currents are determined by measuring a sharpness P of the electron beam. The sharpness P is defined as a product of $p_x$, a sharpness measured when the electron beam is deflected in X direction, and $p_y$, a sharpness measured when the electron beam is deflected in Y direction: $P = p_x \times p_y$. The use of the sharpness P provides good convergence of the measurements and it becomes possible to calibrate the electron beam for many points in the scanning field. Thus, it is possible to attain maximum resolution over an entire scanning field. Optimum correction currents are determined from data obtained by varying each correction current while keeping the other correction currents constant to obtain several values of P and then using a least square approximation of the measured values of P with a quadrature curve.

19 Claims, 6 Drawing Sheets

CALIBRATION METHOD FOR ELECTRON BEAM EXPOSER

BACKGROUND OF THE INVENTION

The present invention relates to a method for adjusting an electron beam apparatus to minimize its aberration due to astigmatism and field curvature of focus, and particularly, a method of calibrating a current to be fed to correction coils.

Electron beam exposers are widely used for mask making or pattern exposure in semiconductor production, especially in integrated circuits (IC) or large scale integrated (LSI) circuits. As the rate of integration increases, such as for very large scale integrated (VLSI) circuits, the pattern to be exposed on a chip becomes both fine and large. For example, the chip size may be more than $10 \times 10$ mm$^2$, but the line width to be exposed may be less than one $\mu$m. In such a large chip having such fine patterns, aberration and distortion of the electron beam becomes a limiting factor in pattern exposure.

In order to overcome such difficulties, the pattern of a chip is subdivided into plurality of sub-patterns, and the sub-patterns are exposed one by one, shifting the exposure area from sub-pattern to sub-pattern. The main pattern and sub-pattern of the chip are called, in the art, a main field and a sub-field, therefore, these terms will be used hereinafter. Even for such subdivided patterns (fields) the limiting factor of the resolution is the aberration and distortion of the electron beam. Further, it is undesirable to divide the field into a large number of sub-fields, because this increases the time necessary to expose the entire field and increases the errors. Therefore, it is desirable to decrease the aberration and distortion as much as possible for a large scanning area.

Errors of images exposed by electron beams are divided into aberration and distortion. Aberration includes astigmatism, field curvature of focus, coma aberration and transverse chromatic aberration. Coma and transverse chromatic aberrations are considered intrinsic in an electron beam apparatus because of the design of the focusing system, and are difficult to correct. On the other hand, astigmatism and field curvature of focus can be corrected, together with distortion. Therefore, most modern electron beam exposers are provided with correction coils to correct such errors.

Another bottleneck in electron beam exposure is processing speed, because more than one million exposures are required to expose the entire surface of a wafer. Therefore, the exposure is controlled by computer and the process is generally automated. But the corrections for astigmatism and field curvature of electron beam are still performed manually. So the correction is done only at the center or at some predetermined spots of the sub-pattern, and the whole sub-pattern is exposed using only the correction factors for the predetermined spots. So far as the inventors know, there have been very few attempts to perform the calibrations at several points in the pattern with the aid of a computer. Even when such attempts have been made, the calibration for the portions of the deflection field other than the calibrated points is carried out using the appropriate interpolation or mean value of those correction factors. By prior art methods, therefore, it is impossible to attain the best possible resolution of an electron beam over the entire surface of the chip to be exposed.

Figure 1A:
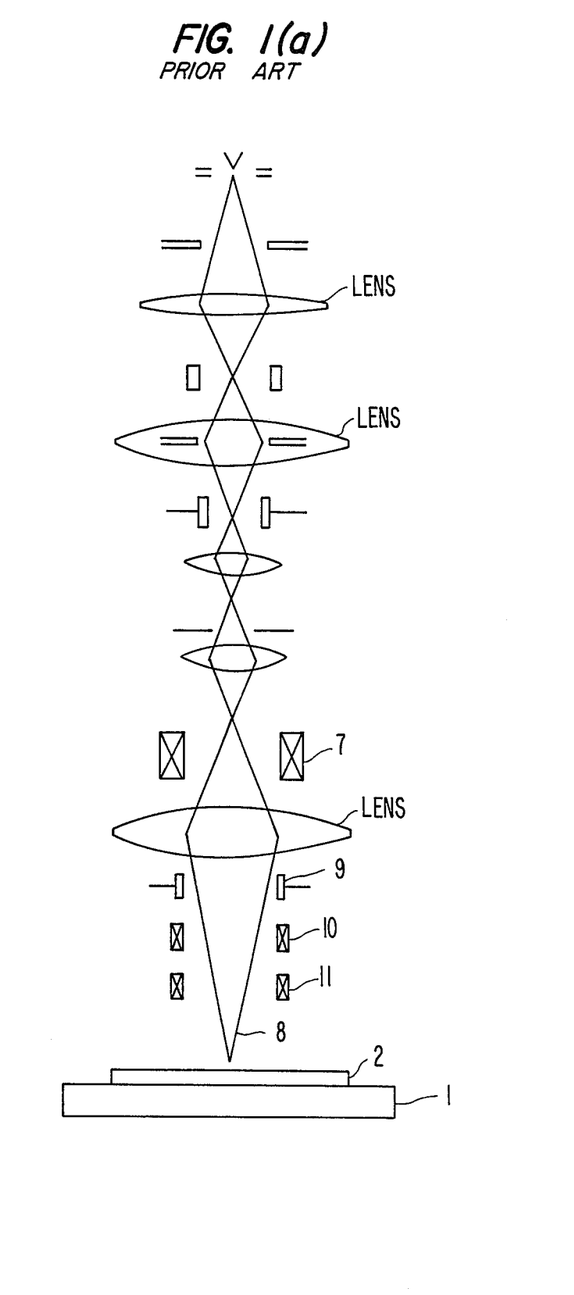
FIG. 1(a) is a schematical diagram illustrating the exposure of a substrate by an electron beam.

To clarify the advantages of the present invention over the prior art, a prior art method for electron beam exposure will be described briefly. FIG. 1 illustrates an ordinary method for exposing an IC substrate with a electron beam. Explanations will be made for the parts which relate to the present invention. As shown in FIG. 1(a), the IC wafer 2 is mounted on a table 1 which slides in the X and Y directions, called an XY-table. An electron beam 8 is focused on the surface of the slice 2 by an electron beam lens system. Using a main deflector 7 and a sub-deflector 9, the electron beam 8 is scanned over the substrate to expose a chip with a predetermined pattern. When the exposure of a chip is completed, the XY-table 1 slides to bring the main field of the next chip to the exposure area.

Figure 1B:
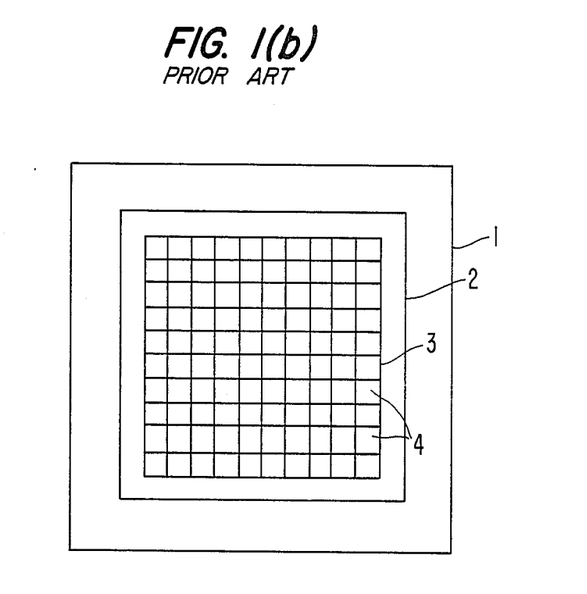
FIG. 1(b) is a plan view of a substrate illustrating the division of the substrate into a plurality of mainfields.

FIG. 1(b) illustrates a plan view of an IC wafer 2 placed on the XY-table 1. Wafer 2 has a square shape as shown in the side view of FIG. 1(a); however, wafers 2 usually have a circular form. A patterning area 3 of the wafer 2 is divided into a plurality of main fields 4, as shown in FIG. 1(b). Each main field corresponds to one chip of an IC, and a plurality of chips are fabricated on a wafer. An exposure is performed for each main frame (chip), and when the exposure is completed, the XY-table slides one pitch of the main field.

Figure 1C:
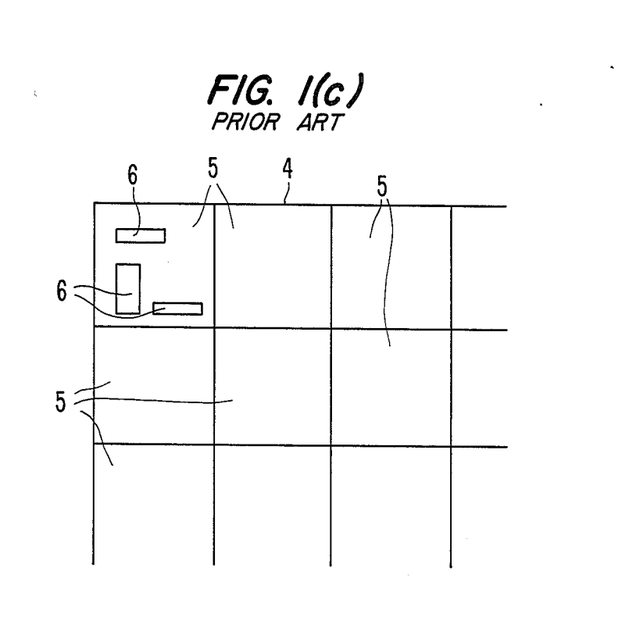
FIG. 1(c) is an expanded plan view of a part of the substrate, illustrating how the mainfield is further divided into a plurality of sub-fields, and then into patterns.

Each main field 4 is further divided into a plurality of sub-fields 5 as shown in FIG. 1(c). The electron beam 8 is deflected by main deflector 7 to each of the sub-fields and each sub-field is scanned by the electron beam 8 using the sub-deflector 9 to expose patterns 6. When the exposure for a sub-field is completed, the beam is deflected to the next sub-field. In such a manner, when all the sub-fields, i.e., the entire chip, is exposed, the XY-table slides to bring the next main frame (chip) into the exposed area.

Furthermore, FIG. 1(a) also illustrates, schematically, a part of electron beam exposer which is related to the present invention. Recent electron beam exposers are provided with means to correct the astigmatism and field curvature of focus, shown by coils 10 and 11. Coil 10 corrects the astigmatism, and is a so-called "stigmator coil." Coil 11 corrects the field curvature of focus. The calibration of the beam is performed by adjusting the current running through these coils. The present invention concerns a method of operating such correction means, and does not relate to the structure of such means. Thus, the details of these coils and the structure of the electron beam exposer are omitted for the sake of simplicity.

Figure 2:
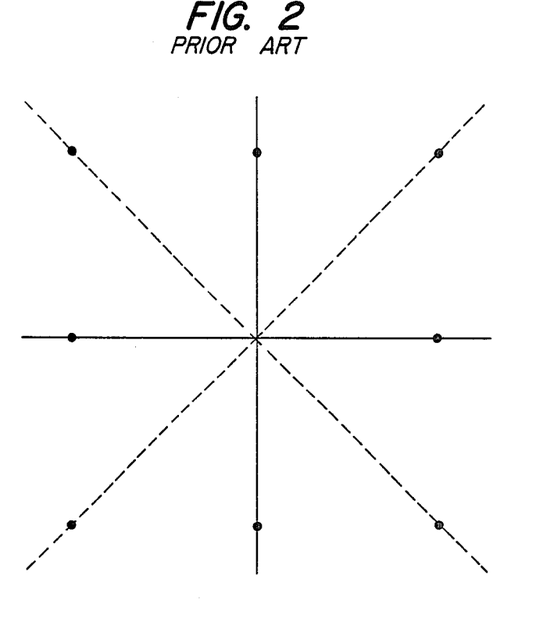
FIG. 2 is an illustration of the deformation of an electron beam spot caused by astigmatism.

As illustrated in FIG. 2, astigmatism is an aberration. FIG. 2 is a plan view showing a beam spot on various parts of scanning area, and emphasizing the deformation of spot. Although the beam is focused in a circular point at the center of the scanning area, it deforms to an oval when the beam is deflected. The deformation of the spot can be corrected by varying the current of coils 10x and 10y (the coils will be described later with respect to FIG. 4.). Since the deformation varies at each point of the scanning area, the correction current should also be varied at each point of the scan.

Figure 3A:
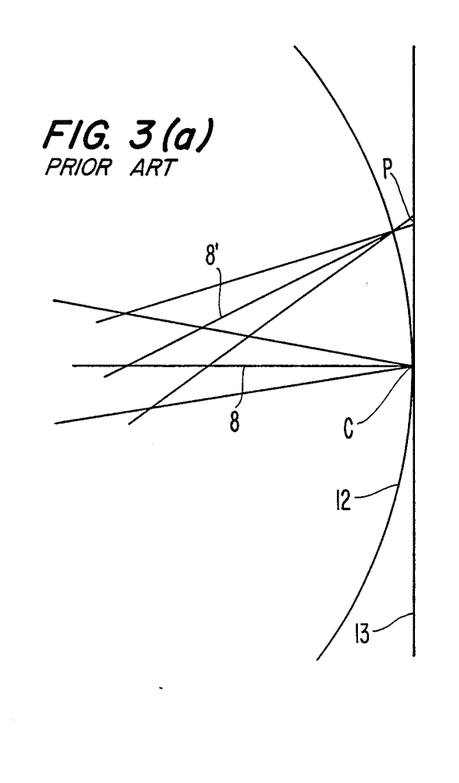
FIG. 3(a) is a side view illustrating the aberration which occurs because of the field curvature of focus.

Abberration due to the field curavature of focus is illustrated in FIG. 3. FIG. 3(a) shows, schematically, a side view of an electron beam. Generally, an electron beam is focused on a spherical surface 12, whose radius is related to the focal length of the electron beam lens. If the electron beam 8 is focused on the center C of a flat main field 13 and if a deflected beam 8' is directed to a point P, the beam spot will blur, as illustrated in FIG.

Figure 3B:
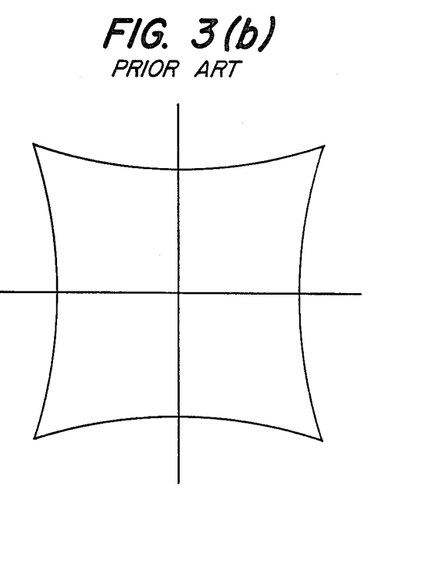
FIG. 3(b) is a plan view illustrating the deformation of a pattern caused by the field curvature of focus.

3a. Additionally, a square pattern, for example, will be deformed as shown in FIG. 3(b). The aberration shown in FIG. 3(a) can be corrected by adjusting the current of the coil 11. The curvature of the pattern shown in FIG. 3(b) is not aberration, but deformation, so it can be corrected by adjusting subdeflector 9 when correcting other deformations. The present invention relates to the correction of aberration of an electron beam spot due to astigmatism (FIG. 2) and the aberration due to the field curvature of focus (FIG. 3(a)). It will be obvious that this kind of aberration must be corrected at every point in the scanning area in order to attain the maximum resolution over the entire field of scanning.

Astigmatism and field curvature of focus are theoretically different phenomena and are independent of each other. But, in practice, if one of them is corrected by a correction means (coils), the other is affected. Thus, there is a correlation between them for the correction means, making the calibration more difficult.

Figure 4:
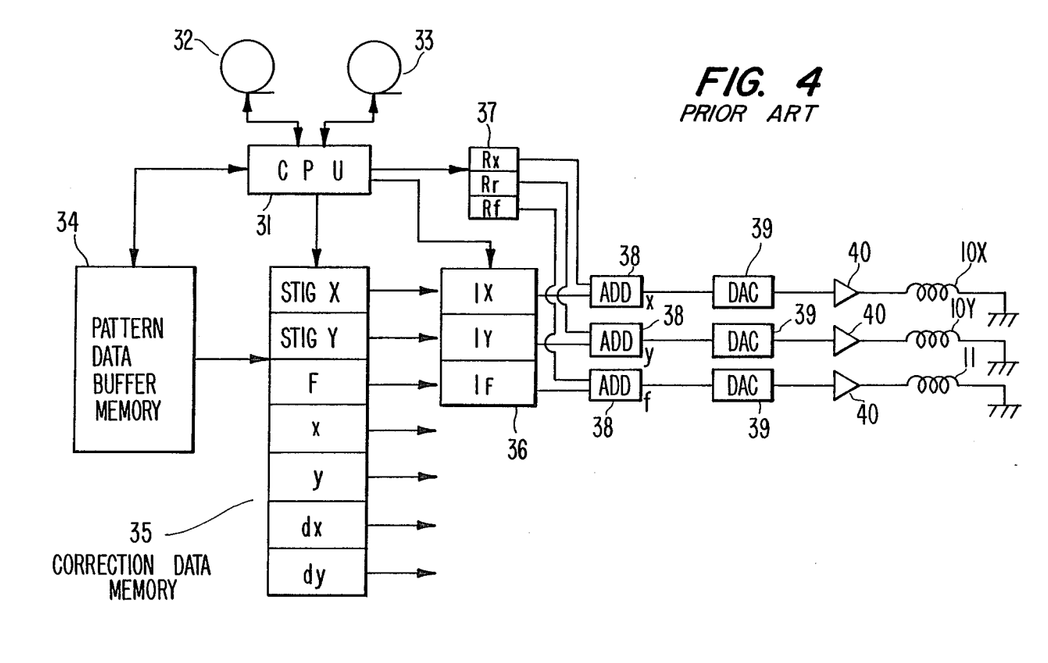
FIG. 4 is a block diagram of a control system for an electron beam exposer, illustrating, schmatically, an apparatus for correcting the aberration due to astigmatism and field curvature of focus.

FIG. 4 is a block diagram illustrating a conventional system for calibrating the astigmatism and field curvature of focus. There may be many types of systems for this purpose, so FIG. 4 shows a typical system. The system comprises a computer 31 which is a central processing unit (CPU). The CPU 31 controls not only the calibration, but it also aids the operator in obtaining the correction factors. The CPU 31 also controls the entire electron beam exposure system. For example, control of the XY-table, deflection and scanning of electron beam and turning the electron beam on and off to expose the pattern are all controlled by CPU 31. These functions, however, are omitted from FIG. 4 for the sake of simplicity, and will not be described herein.

In the example of FIG. 4, pattern data which describes the position and size of patterns is stored on a magnetic tape 32, and correction data which describes the correction factors of each beam position is stored on a magnetic tape 33. Before starting the exposure, the CPU 31 reads out and stores such data, respectively, in a pattern data buffer memory 34 and a correction data memory 35.

Correction data stored in the memory 35 includes:

stig x, the correction data for astigmatism in X direction;

stig y, the correction data for astigmatism in Y direction;

focus F, the correction data for aberration due to the field curvature of focus; and other correctio data such as the correction of shrinkage or expansion of sub-fields (denoted x and y in the figure), and distortions (denoted dx and dy in the figure). This data is used for correcting the electron beam under the control of the CPU 31, but only the use of stig x, stig y and focus F will be described herein.

When the exposure begins, the CPU assigns the sub-filed and pattern position. Then the correction data stig x, stig y and F corresponding to the sub-field and pattern position, the position to where the electron beam is deflected, are read from the correction data memory 35 and sent to a register 36, where they are stored, respectively, as values of the current to be supplied to the stigmator coils 10x, 10y and focus correction coil 11 (the current values are denoted Ix, Iy and IF, respectively). The respective data signals are sent to an adder (ADD) 38 and then to a digital analog converter (DAC) 39 associated with each of the coils 10x, 11y and 11, where they are converted to analog signals, amplified by amplifiers 40 and fed to coils 10x, 10y and 11, respectively.

At the same time, the CPU 31 controls the electron beam exposer to deflect the beam 8 to the position determined by the same pattern data. So the beam is corrected by the correction data stored in the magnetic tape 33.

The system of FIG. 4 is provided with a second register 37 which is used for computer aided measurements. Operation of the second register 37 and the adders 38 will be explained later with reference to an embodiment of the present invention.

The problem is how to develop the correction data—in other words, how to obtain the data stored in the correction data memory 35 in FIG. 4. The present invention is related to a method of obtaining the data of stig x, stig y and focus F. As mentioned before, these three types of correction data are interrelated, and thus it is very difficult to obtain the optimum point.

Correction data can be obtained from a measurement of sharpness of the electron beam and various methods may be designed for measuring the sharpness of an electron beam. One example which is often used will be explained with reference to FIGS. 4 through 7. The measurement of the sharpness of the beam can be carried on manually or with an aid of a computer. At first, it will be explained how the sharpness of the beam spot is determined and how it is measured.

Figure 5:
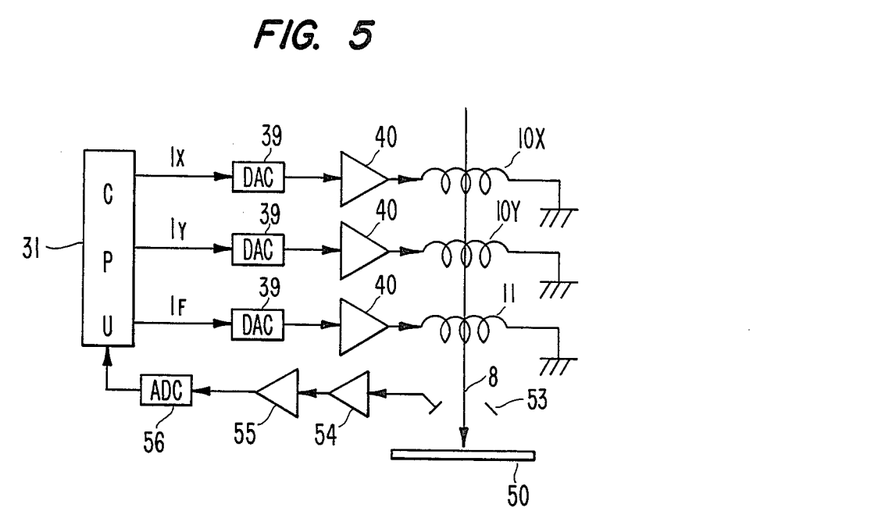
FIG. 5 is a block diagram illustrating a main portion of a system for measuring sharpness of the beam and calibrating the aberration.
Figure 6:
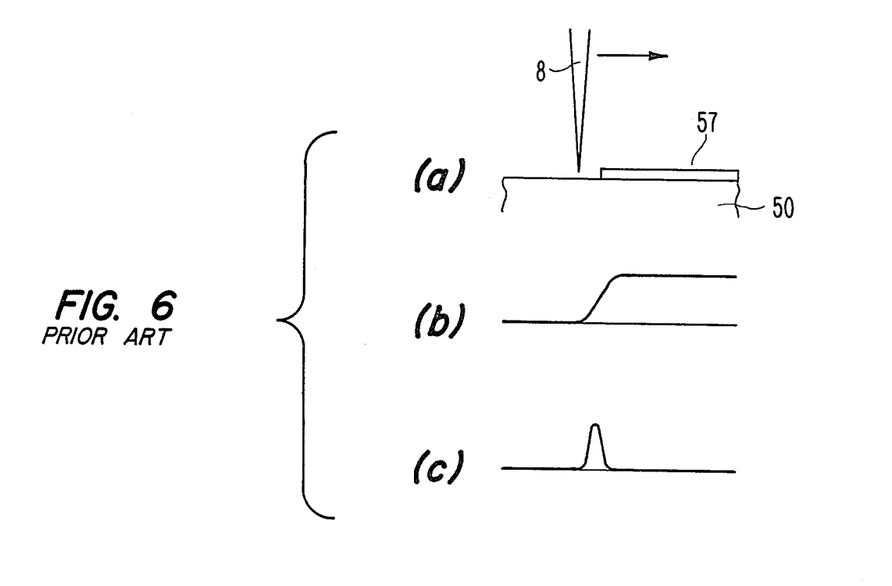
FIG. 6(a) is a side view of an electron beam and a cross-sectional view illustrating a test mark.
FIG. 6(b) is a diagram illustrating a variation of a scattered electron current at the edge of the test mark.
FIG. 6(c) is a diagram illustrating a curve showing the sharpness of the electron beam.

FIG. 5 is a schematical diagram showing part of the electron beam exposer which concerns the present invention. In FIG. 5, reference numeral 53 designates a detector which collects the scattered electron beam from the surface of the substrate 50. The detector 53 may be an electron collector for scattered or secondary electrons or an electron collector for the portion of the beam transmitted through the substrate. Recent electron beam exposers are provided with such a detector and the explanation below will be made with respect to a system having a scattered electron detector. The substrate 50 has a test mark on its surface, as shown in FIG. 7. The test mark is made from tantalum or gold film and is approximately 5–50 $\mu$m square.

The electron beam 8 is scanned over the test mark, and the scattered electrons are collected by the collector 53 and amplified by an amplifier 54. FIG. 6(a) illustrates this situation with a side view of the electron beam 8. When the electron beam 8 crosses the edge of the test mark 57, the current of the scattered electrons varies as shown in FIG. 6(b). Since the electron beam 8 has a spot size (not shown in the figure), the change in the measured current varies with a slope as the beam crosses the edge of the test mark, as shown in FIG. 6(b). This slope corresponds to the spot size, that is, the sharpness of the electron beam 8 at the position of the test mark. If the current is differentiated over time for the position x or y, by a differential circuit 55, the output of the differential circuit 55 is in the form of a pulse, as shown in FIG. 6(c). The size of this pulse also corresponds to the sharpness of the electron beam at the position of the test mark. Such measurement can be performed manually or with the aid of the CPU 31 shown in FIG. 5. In this case, the output of the differential circuit 55 is fed to an analog to digital converter (ADC) 56, and then sent back to the CPU 31 for a calculation of the correction factor.

FIG. 5 shows, schematically, how the astigmatism and field curvature of focus are corrected in a conventional electron beam exposer. Stigmator coils 10X and 10Y correct the astigmatism in X and Y directions. The stigmator coils 10X and 10Y are composed of four coils (not shown), connected in series, to construct an electron lens. The axes of the electron lens 10X and 10Y are orthogonal to the axis of the electron beam 8, and are aligned to cross each other with an angle of 45°. By adjusting the current running through coils 10X and 10Y, it is possible to correct the deformation of beam spots due to the astigmatism. A third coil 11 composes another lens for correcting the aberration of focus due to the field curavature of focus by adjusting the current running through the coil.

Figure 7A:
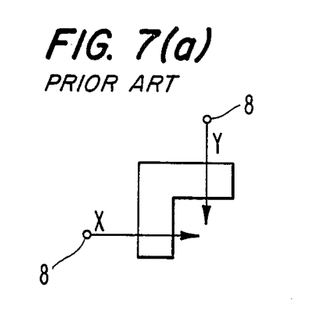
FIGS. 7(a)-(b) are illustrations of sample test marks for measuring the sharpness of the electron beam.
Figure 7B:
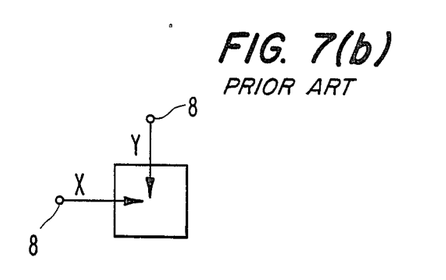

The correction data is obtained as follows. First, the electron beam is deflected in the X and Y directions to an edge of a test mark (two types of test marks are shown in FIGS. 7(a) and (b)), which is moved to a position where correction data is desired. The sharpness of the beam is measured in the manner described above, manually or with the aid of a CPU. For example, at first the sharpness $p_x$ for the X direction is measured, keeping $I_y$, the correction current for the stigmator 10Y, and $I_F$, the correction current for the coil 11, constant. Next, $I_x$, the correction current for the stigmator 10X, is varied, causing a corresponding variation in the sharpness $p_x$, and the current $I_x$ for the maximum value of the $p_x$ is determined. Generally, this value is considered as the correction factor for the coil 10X. Similarly, the correction factors for coils 10Y and 11 are determined by keeping the correction currents for other coils constant.

As has been mentioned before, however, thre are correlations between these corrections. So if the maximum value of $p_x$ is measured while $I_y$ and $I_f$ are fixed, then, for example, $p_x$ will vary when $I_y$ or $I_F$ are varied. In order to avoid this problem, the measurements are repeated several times, setting the correction current for other coils to that of the previous measurement. Thus, the calibration for each coil is optimized asymptotically by repeating the measurements, but this method requires an extended period of time.

To obtain the calibration factors, therefore, the measurement is usually performed for only one point per sub-frame, or for several points per main frame. The calibration for other parts of the chip is determined from such data or from a mean or interpolation of the data. Accordingly, it has been impossible to obtain optimum focusing conditions over the entire surface of the chip, and it has been impossible to attain the maximum resolution of the electron beam exposer. Moreover, though it is theoretically possible to calibrate the focusing at all points over the chip, it is necessary to renew the correction data occasionally, for instance once a week or once a day before the beginning of the exposure process, in order to attain the maximum resolution because the stability of such apparatus is very critical. However, such calibration has been impossible and impractical for prior art electron beam exposers.

SUMMARY OF THE INVENTION

An object of the present invention is to provide a calibration method for an electron beam exposer for easily obtaining the correction factors.

Another object of the present invention is to provide a calibration method for an electron beam exposer for obtaining the correction factors quickly.

A further object of the present invention is to provide a calibration method for astigmatism and field curvature of focus in an electron beam apparatus over the entire surface of the scanning field.

Still another object of the present invention is to provide a method for obtaining precise data for the correction of an electron beam exposer.

A still further object of the present invention is to make it easy to operate an electron beam exposer with maximum resolution at every point of the scanning field.

In order to attain the above objects, the present invention introduces a new category of sharpness P, that is a product of prior art sharpness for the X and Y directions. By using this new category of sharpness P, it is possible to obtain the correction factors with very good convergence towards the optimum correction value, and the correction factors can be obtained with only one sequence of measurements. Thus, it is easy to include the measurement of sharpness and the calibration of the correction current in the process of CPU controlled exposure.

Another feature of the present invention is an increase in the preciseness of the measurement of sharpness by using a rectangular beam. When the beam is scanned in X direction to obtain the sharpness $p_x$, the beam shape is elongated in the Y direction, and when the beam is scanned in the Y direction to obtain the sharpness $p_y$, the rectangular beam is elongated in the X direction.

Still another feature of the present invention is that the correction factors can be obtained without adverse influence from noise or fluctuations of the apparatus. For this purpose, the present invention measures the sharpness at relatively separate values of the correction current, and the optimum value is calculated by a least square method approximating the measured value to a quadratic curve.

These features, together with other objects and advantages, will be apparent as more fully described and claimed below, reference being had to the accompanying drawings wherein like numerals refer to like parts throughout.

BRIEF DESCRIPTION OF THE DRAWINGS

FIGS. 1(a)-(c) are drawings illustrating a conventional method of electron beam exposure, wherein:

FIGS. 3(a)-(b) are drawings to explain the field curvature of focus, wherein:

FIGS. 6(a)-(c) are drawings illustrating a method of measuring the sharpness of an electron beam, wherein:

DESCRIPTION OF THE PREFERRED EMBODIMENTS

In accordance with the present invention, the correction factors for aberration due to the astigmatism and field curvature of focus are obtained as follows. Referring to FIG. 4, pattern data and correction data stored on magnetic tapes 32 and 33 is transferred to a pattern data buffer memory 34 and a correction data memory 35, respectively, and stored there together with other correction factors under the control of the CPU 31. The correction data is obtained from a previous measurement, and, if it is the first measurement, the correction data values are all zero. The CPU 31 determines a position (X,Y coordinates) where a calibration is to be performed, and then the correction data stig x, stig y and F, for the astigmatism in X and Y directions and the field curvature of focus, respectively, at the appointed position are read out from the correction data memory 35 and sent to a register 36; the correction data is stored in register 36 as correction current data $I_x$, $I_y$ and $I_F$, written in digital form, in a manner similar to the prior art method previously described. At the same time, the electron beam 8 is deflected to the appointed position by the main deflector 7 and the sub-deflector 9 which are under the control of the CPU 31. The details of the method of controlling the electron beam will not be described herein, since a conventional method is employed.

The electron beam 8 is corrected using the correction current data $I_x$, $I_y$ and $I_F$ in a conventional manner. Namely, the correction currents are supplied to respective coils 10X, 10Y and 11 via adders 38, digital to analog converters 39 and amplifiers 40.

The measurement of the correction factors in accordance with the present invention begins with the provision of a test mark, as shown in FIGS. 7(a) and (b), which is moved by the XY-table 1 to the position where the calibration is to be performed. This movement is done under the control of the CPU 31. By super-imposing a small AC voltage on the sub-deflector 9, the electron beam spot is slightly deflected in the X and Y directions so that it crosses the edge of the test mark in X and Y directions, as shown in FIGS. 7(a) and (b). Then, in a same manner as described with respect to the conventional method, the sharpness $p_x$ in X direction and the sharpness $p_y$ in Y direction are measured. The CPU 31 obtains the values $p_x$ and $p_y$ and a new category of sharpness P is defined as the product of $p_x$ and $p_y$:

$$P = p_x \times p_y$$

Using this new category of sharpness P, the present invention determines the optimum value of the correction factors, which will be explained with respect to an embodiment of the measuring process used to obtain the correction factor stig x. The previous value of the sharpness P is called $P_0$, and keeping the values if $I_y$ and $I_F$ constant (these values use the data of a previous calibration) the value of $I_x$ is varied. Namely, the CPU 31 sends a first member $R_{x1}$ stored in the second register 37 to the X adder 38x. The numbers stored in the second register 37 will be explained later. Then the adder 38x adds the values of $I_x$ and $R_{x1}$ to determine a new value $I_{x+1}$. For this new value of $I_{x+1}$, the sharpness P is measured and denoted $P_1$. When $P_1$ is measured, the CPU 31 commands the second register 37 to send a second number $R_{x2}$ to the adder 38x. Then a sharpness $P_2$ for the correction current $I_{x+2}$ is measured and, in a similar manner, the sharpness P is measured for various current values of $I_x$.

Figure 8:
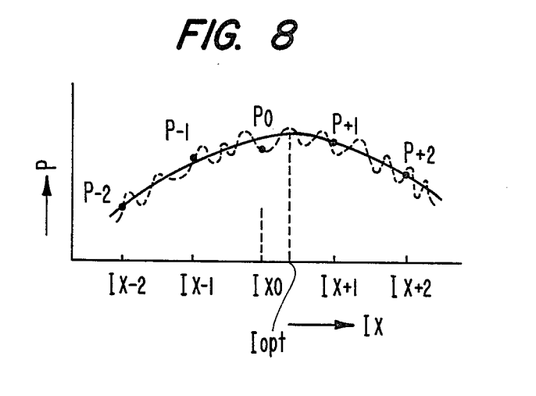
FIG. 8 illustrates the method of obtaining the optimum value of the correction factor $I_x$ from measured value of sharpness P, by the method of the present invention.

FIG. 8 shows an example of measured values of P for various values of $I_x$, wherein $P_0$ is the value of P measured for $R_{x0}$, i.e., zero, and corresponds to the value of P measured using the previous correction current $I_{x0}$, which has been stored on the magnetic tape 33. The sign of $R_x$ is changed from + to −, and the values $I_{x-1}$, $I_{x-2}$ and $P_{-1}$, $P_{-2}$ are obtained. It will be understood from the above explanation that the value of $R_x$ determines the difference of $I_x$ between the measurements—in other words, it indicates the distance between the measuring points on the horizontal axis in the graph of FIG. 8.

The second register 37 stores a plurality of numbers $R_x$ for measuring stig x, and a plurality of numbers for each of $R_y$ and $R_F$, respectively used for the measurement of stig y and focus F. The measurements of stig y and focus F are performed in a similar manner to the above disclosure.

In practice, the measured value of the sharpness includes error and noise. So, it is is measured with a short distance between the measuring points, the data will be an irregular curve as indicated by broken line in FIG. 8. Therefore, it is meaningless to measure P using numbers for $R_x$, $R_y$ and $R_F$ which have small differences and thus provide a short distance between the measuring points. Moreover, if measurements are performed using measuring points having a very close distance, there is a chance that a small peak or small valley of the irregular curve will be mistaken as the maximum or minimum value of P.

The value of $R_x$ is determined empirically from the experience of the inventors and it has been determined effective to select the value of $R_x$ so that the measured value of P varies about 5-10% from that of the previous measurement. An optimum value of $I_x$, called $I_{opt}$, is obtained by a calculation utilizing a least square method. In this case, it is effective to approximate the measured curve of P (solid line of FIG. 8) with a quadratic curve, and the five measurements of P shown in FIG. 8 are enough measurements for the approximation. This method for calculating the value of $R_x$ is one feature of the present invention.

It was found further that by using the new category of sharpness P, the convergence of the measured value to the optimum value is very good, though there is a correlation between $I_x$, $I_y$ and $I_F$. Usually only one sequence of measurements for each point is enough. In a rare case, when all values of $I_{x0}$, $I_{y0}$ and $I_{F0}$ are zero, i.e., at the beginning of a new pattern generation, two or three sequences of measurements are required for each point. Namely, at first $I_x$ is determined keeping $I_y$ and $I_F$ at zero, then $I_y$ is determined, using the determined value of $I_x$. Next, $I_F$ is determined using the determined values of $I_x$ and $I_y$. Then measurements are repeated using the determined values of $I_x$, $I_y$ and $I_F$, respectively. But since the convergence of the data is very good, two sequences of measurements usually provide the final value.

The command for the measurements and calculations are performed by the CPU 31; however, the details of the commands will be omitted since they involve an ordinary application of a computer. The calculated optimum values of $I_x$, $I_y$ and $I_F$ are stored in the memory of the CPU until the measurements for other measuring points are completed, and then they are sent to the magnetic tape 33 as replacements for the former values.

Figure 9:
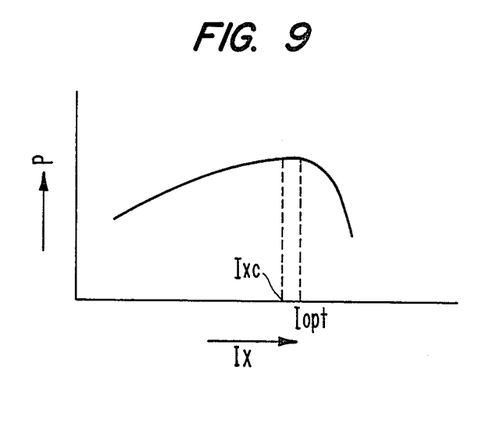
FIG. 9 is a curve illustrating how the optimum value of the correction factor $I_x$ is obtained for an uneven curve of the measured value.

Sometimes, the measured value of P varies unevenly with respect to the correction current ($I_x$, for example) as shown in FIG. 9, where the maximum value of P is located very close to the sharp fall of the curve. In such case, the value of the correction current $I_{xc}$ should be slightly less than the optimum value $I_{opt}$—to the left side in FIG. 9—to avoid instability of the apparatus. For such a purpose, the above-mentioned least square method is very convenient and practical; an approximation with a quadratic curve automatically yields a separate point from the optimum value $I_{opt}$. This is a feature of the least square, and if $I_{xc}$ is approximated more precisely, with higher order curves, the calculation will give the correct value of $I_{opt}$. But as mentioned above, such a corrected value of $I_{xc}$ is not desirable from the viewpoint of stability. Such calculation of $I_{xc}$ is another feature of the present invention.

In the above method for obtaining the correction factors, it is desirable to use a variable rectangular beam having sides oriented in the X and Y directions. Such variable rectangular beams are widely used in recent electron beam exposers. In order to measure $p_x$, the sharpness in the x direction, the beam 8 is elongated in the Y direction and deflected in the X direction, as shown in FIG. 7. On the contrary, when the beam 8 is deflected in the Y direction to obtain $p_y$, the sharpness in the Y direction, the beam is elongated in the X direction. By doing so, it will be obvious that the variation of scattered electron current as shown in FIG. 6(b) becomes sharper, and the pulse of the curve shown in FIG. 6(c) becomes higher. Therefore, higher accuracy data is available. This is still another feature of the present invention.

In the above disclosure, the sharpness is determined by the height of the pulse of FIG. 6(c), and a new category of sharpness is defined as the product of $p_x$ and $p_y$. But it is possible to define other new categories P' and P'' as $$P' = p_x^2 + p_y^2$$

and $$P'' = |p_x| + |p_y|,$$

and to use P' or P'' in place of P. It is also possible to define the sharpness by the width of the pulse of FIG. 6(c). In such modification, it will be obvious that the optimum values of $I_x$, $I_y$ and $I_f$ should be obtained from the minimum point of curves corresponding to FIG. 8 or FIG. 9.

Furthermore, in addition to the fact that the measurement of the sharpness of the beam and correction of the aberration is simplified, it is also unnecessary to calibrate the beam at all of the points to be exposed. Specifically, it is sufficient if the beam is calibrated for a predetermined matrix of points in each sub-field, and the calibration for the other points in each sub-field can be performed using a calibration factor which smoothly connects the measured values. There are many methods available for such a purpose, including interpolation, extrapolation and so on.

As has been described above, it will be clear that by the use of the method of the present invention, it is easy and simple to obtain the correction factors for aberrations due to astigmatism and field curvature of focus. Thus, it is possible to calibrate the electron beam at many points in the field to be scanned in order to obtain the maximum resolution of the apparatus. The disclosure has been done with respect to an electron beam exposer, but the calibration method of the present invention can be applied to any kind of electron beam apparatus.

The many features and advantages of the present invention are apparent from the detailed specification, and thus, it is intended by the appended claims to cover all such features and advantages of the calibration method which fall within the true spirit and scope of the invention. Further, since numerous modifications and applications of the present invention will readily occur to those skilled in the art, it is not desired to limit the invention to the exact construction and operations illustrated and described. Accordingly, all suitable modifications and equivalents may be resorted to, falling within the scope and spirit of the invention.

What we claim is as follows:

1. A method of calibrating an electron beam exposer, for scanning an electron beam over a substrate, by determining correction currents $I_x$, $I_y$ and $I_F$ to be applied to correction coils to correct the aberration due to astigmatism in the X and Y directions and field curvature of focus, respectively, comprising the steps of:
   (a) measuring a sharpness P of the electron beam, said sharpness P being defined as the product of $p_x$, which represents a sharpness defined as the differentiated value of a signal resulting when the electron beam is deflected in the X direction, and $p_y$, which represents a sharpness defined as the differentiated value of a signal resulting when the electron beam is deflected in the Y direction;
   (b) varying one of said correction currents while keeping the other two correction currents constant, and repeating step (a) for each variation of the varied correction current; and
   (c) determining an optimum value for said varied correction current from data obtained in the step (b).

2. A calibration method according to claim 1, wherein the measurement of the sharpness in step (a) includes measuring a variation of electrons scattered by a surface of a test mark, when the electron beam is deflected across an edge of said test mark.

3. A calibration method according to claim 2, further comprising the steps of forming the test mark on a substrate and locating the test mark at a point where the calibration of the electron beam is to be performed.

4. A calibration method according to claim 1, wherein the determination of the optimum value of the correction current in step (c) includes approximating the measured value by a least square method with a quadratic curve.

5. A calibration method according to claim 1, wherein step (b) includes varying the varied correction current so that each measured value of P varies by about 5-10% from the previous value.

6. A calibration method according to claim 1, wherein the measurement of $p_x$ and $p_y$ in step (a) includes elongating the electron beam spot in the Y direction when $p_x$ is measured, and elongating the electron beam spot in the X direction when $p_y$ is measured.

7. A calibration method according to claim 1, wherein the substrate includes a plurality of deflection fields, further comprising the steps of determining correction currents at predetermined matrix points in each deflection field, and determining the correction currents for other points from the correction currents for the predetermined matrix points.

8. A calibration method according to claim 1, further comprising the step of (d) setting the the varied correction current at the optimum value determined in step (c).

9. A calibration method according to claim 8, further comprising the steps of:
(e) repeating steps (a)-(d) to determine an optimum value for each of the correction currents; and
(f) repeating steps (a)-(e) until the optimum values of the correction currents converge.

10. A method for calibrating an electron beam exposer, for scanning an electron beam over a substrate, by determining correction currents $I_x$, $I_y$ and $I_F$ to be applied to correction coils for correcting aberrations of the electron beam due to astigmatism in the X and Y directions and field curvature of focus of the electron beam, respectively, comprising the steps of:
(a) setting each of the correction currents at an initial value;
(b) measuring a sharpness $p_x$ of the electron beam when the electron beam is deflected in the Y direction;
(c) measuring a sharpness $p_y$ of the electron beam when the electron beam is deflected in the Y direction;
(d) determining a sharpness P of the electron beam in terms of the product of $p_x$ and $p_y$;
(e) varying one of the product of the correction currents and repeating steps (b)-(d) for the varied correction current;
(f) determining an optimum value of the varied correction current from the data obtained in step (d);
(g) repeating steps (e) and (f) to determine an optimum value for each of the correction currents.

11. A calibration method according to claim 10, wherein step (f) includes setting the varied correction currents at the optimum value.

12. A calibration method according to claim 10, wherein the measurements of steps (b) and (c) are performed by deflecting the electron beam across an edge of a test mark and measuring a variation of electron scattered by a surface of the test mark.

13. A calibration method according to claim 10, wherein step (e) includes varying the correction currents so that each value of the sharpness P determined in step (d) varies by 5-10% from the previously determined value of the sharpness P.

14. A calibration method according to claim 1, wherein the measurement of the sharpness in step (a) includes measuring a variation of secondary electrons emitted from a surface of a test mark, when the electron beam is deflected across an edge of the test mark.

15. A calibration method according to claim 1, wherein the measurement of the sharpness in step (a) includes measuring a variation of electrons transmitted through the test mark when the electron beam is deflected across an edge of the test mark.

16. A calibration method according to claim 14, further comprising the steps of forming the test mark on a substrate and locating the test mark at a point where the calibration of the electron beam is to be performed.

17. A calibration method according to claim 15, further comprising the steps of forming the test mark on a substrate and locating the test mark at a point where the calibration of the electron beam is to be performed.

18. A calibration method according to claim 2, wherein said sharpnesses P, $p_x$ and $p_y$ are defined by the width of the beam spot in the X and Y directions.

19. A calibration method according to claim 10, wherein the substrate includes a plurality of deflection fields, further comprising the steps of determining the correction currents at predetermined matrix points in each deflection field, and determining the correction currents for other points from the correction currents for the predetermined matrix points.

* * * * *

UNITED STATES PATENT AND TRADEMARK OFFICE
CERTIFICATE OF CORRECTION

PATENT NO. : 4,763,004

DATED : August 9, 1988

INVENTOR(S) : Yasuda et al.

It is certified that error appears in the above-identified patent and that said Letters Patent is hereby corrected as shown below:

Col. 2, line 4, "a" should be --an--.

Col. 3, line 49, "correctio" should be --correction--;
line 56, "filed" should be --field--.

Col. 5, line 29, "thre" should be --there--.

Col. 6, line 63, "schmatically" should be --schematically--.

Col. 8, line 19, "ina" should be --in a--;
line 30, "measurement-" should be --measurements- --;
line 31, delete "s---";
line 41, "it is" should be --if it--.

Col. 12, line 1, delete "product of the";
line 14, "electron" should be --electrons--.

Signed and Sealed this

Third Day of January, 1989

Attest:

DONALD J. QUIGG

Attesting Officer

Commissioner of Patents and Trademarks